United States Patent [19]

Kaminsky et al.

[11] Patent Number: 5,678,752
[45] Date of Patent: Oct. 21, 1997

[54] WAVE SOLDERING PROCESS

[75] Inventors: Mike Kaminsky, Charlotte, N.C.;
Richard Noreika, Endicott, N.Y.;
George D. Oxx, Jr., Charlotte, N.C.;
Daniel Potsko, Endwell, N.Y.

[73] Assignee: International Business Machines Corporation, Armonk, N.Y.

[21] Appl. No.: 509,925

[22] Filed: Aug. 1, 1995

[51] Int. Cl.$^6$ .................... H05K 3/34; B23K 3/00
[52] U.S. Cl. .................... 228/223; 228/232; 228/20.1; 228/37
[58] Field of Search .................... 228/20.1, 37, 205, 228/223, 232, 260

[56] References Cited

U.S. PATENT DOCUMENTS

| | | | |
|---|---|---|---|
| 4,648,547 | 3/1987 | Mahler et al. | 228/20.1 |
| 4,708,281 | 11/1987 | Nelson et al. | 228/223 |
| 5,379,943 | 1/1995 | Gibson | 228/20.1 |

*Primary Examiner*—P. Austin Bradley
*Assistant Examiner*—Jeffrey T. Knapp
*Attorney, Agent, or Firm*—Calfee, Halter & Griswold

[57] ABSTRACT

A liquid flux using water instead of a volatile organic compound as the liquid carrier is used in a wave soldering process. Undesirable formation of solder balls, solder bridges and solder webbing is prevented by using an air knife to direct a vigorous jet of gas at the dielectric substrate in the preheating section.

22 Claims, 2 Drawing Sheets

WAVE SOLDERING PROCESS

BACKGROUND OF THE INVENTION

The present invention relates to an improved wave soldering process.

Wave soldering is a well-known manufacturing technique for soldering electronic components to dielectric substrates such as printed circuit boards and the like. In such processes, the circuit board containing one or more electronic components whose leads are fitted into predrilled holes is contacted with a flux, treated to remove excess flux, preheated to dry the flux remaining on the board and then contacted with a wave of molten solder to form the necessary solder joints. In earlier processes, the soldered board after removal from the solder wave was subjected to a subsequent cleaning operation to remove solder balls, flux residues and the like, for example by immersing the board in a liquid bath. More modern processes use "no-clean" fluxes which leave little or no residue, and no solder balls if the flux is dried properly during preheating, hence eliminating the need for a subsequent cleaning step. U.S. Pat. No. 5,297,724 to Mehta, et al., the disclosure of which is incorporated herein reference, is a good example of modern wave-soldering processes using no-clean fluxes.

A wide variety of different no-clean fluxes are available on the market today. Typically, such fluxes are composed of solid flux components dissolved or dispersed in a liquid carrier composed of a volatile organic compound such as a lower alcohol, e.g. isopropyl alcohol, or the like.

Because of environmental concerns, efforts are underway to develop no-clean fluxes which contain no volatile organic compounds. A number of such compositions in which water replaces the volatile organic compound as the liquid carrier have been developed and are commercially available. Although such compositions work well in general, it has been found that when used in automatic wave soldering processes such as illustrated in the above-mentioned U.S. Pat. No. 5,297,724, an excessive and unacceptable amount of solder balls, solder bridges and solder webbing forms on the product dielectric substrate, particularly when the predrilled holes in the substrate are of the "plated-through" variety.

In order to deal with this problem, it has been proposed to increase the amount of heat supplied to the dielectric substrate during the preheating step to account for the lower volatility of water as compared to the liquid carriers traditionally used in no-clean fluxes. For example, it has been proposed to increase the temperature of, and hence the heat flow provided by, the radiant heaters typically used as the preheating source in many conventional wave soldering machines. Another proposal has been to supply additional heat by convention, that is by adding additional equipment to conventional machines using radiant preheaters to supply the additional heat required in the form of hot air or gas. See, for example, FIGS. 5 and 6 of the above noted U.S. Pat. No. 5,297,724 to Mehta, et al. as well as FIGS. 6 and 7 in U.S. Pat. No. 3,604,611 to Lamberty, the disclosure of which patent is also incorporated herein by reference.

In practice, however, it has been found that neither of these techniques is particularly effective. In particular, it has been found that a mere increase in heat duty, even where this increase is more than enough to account for the lower volatility of water, will not prevent formation of solder balls, solder bridges and solder webbing when water-based fluxes are used. Therefore, there is a need to develop a new technique for wave soldering dielectric substrates which can accommodate the use of water-based no-clean fluxes without forming undesirable solder balls, solder webbing and solder bridging.

It is also desirable that such a technique be useful for practice by the many automatic wave soldering machines already in commercial use in industry throughout world. Ninety to ninety-five percent of the automatic wave soldering machines in commercial use today employ radiant heaters as the source of heat energy in the preheating section, and such machines have an inherent limit on the amount of heat that can be generated by these radiant heat sources. It is particularly desirable to develop a simple and inexpensive way of retrofitting such machines so that they can accommodate the use of water-based no-clean fluxes while at the same time continuing to produce product exhibiting little or no solder balling, solder bridging and solder webbing.

SUMMARY OF THE INVENTION

In accordance with the present invention, it has been found that a vigorous jet of air or other gas arranged to impinge on the dielectric substrate during preheating totally eliminates formation of solder balls, solder bridges and solder webbing in the product soldered substrate, even if a water-based compositions is used as the flux.

Accordingly, the present invention provides a new wave soldering process for forming soldered substrates which comprises contacting a dielectric substrate with a water-based no-clean flux, preheating the substrate after excess flux has been removed to prepare the substrate for soldering and contacting the preheated substrate with a wave of solder to from the necessary solder joints thereon, the process further including directing a vigorous jet of air or other gas at the substrate surface during the preheating operation to thereby eliminate formation of solder balls, bridges or webs during the subsequent soldering operation.

In accordance with a further feature of the invention, it has also been found that the desirable effect of the invention, preventing the formation of solder balls, bridges and webbing in the final product, will be facilitated if the preheaters in the preheating section of a conventional wave solder machine are adjusted so that the dielectric substrate encounters the hottest preheater first as it travels along its travel path through the preheater section. Accordingly, preheating is accomplished in the preferred embodiment of the invention in a manner that not only includes directing a vigorous jet of gas at the substrate during the preheating operation but also includes adjusting the preheaters in the wave soldering machine so that the substrate encounters the hottest preheater first.

BRIEF DESCRIPTION OF THE DRAWINGS

The present invention may be more easily understood by reference to the following drawings wherein.

DETAILED DESCRIPTION

Figure 1:
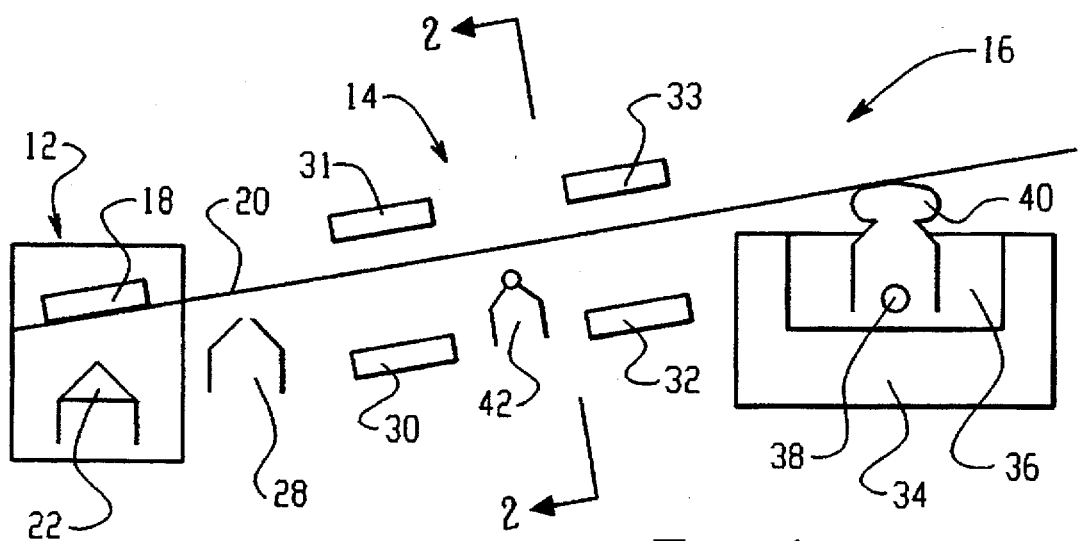
FIG. 1 is a schematic diagram of one embodiment of the present invention.
Figure 2:
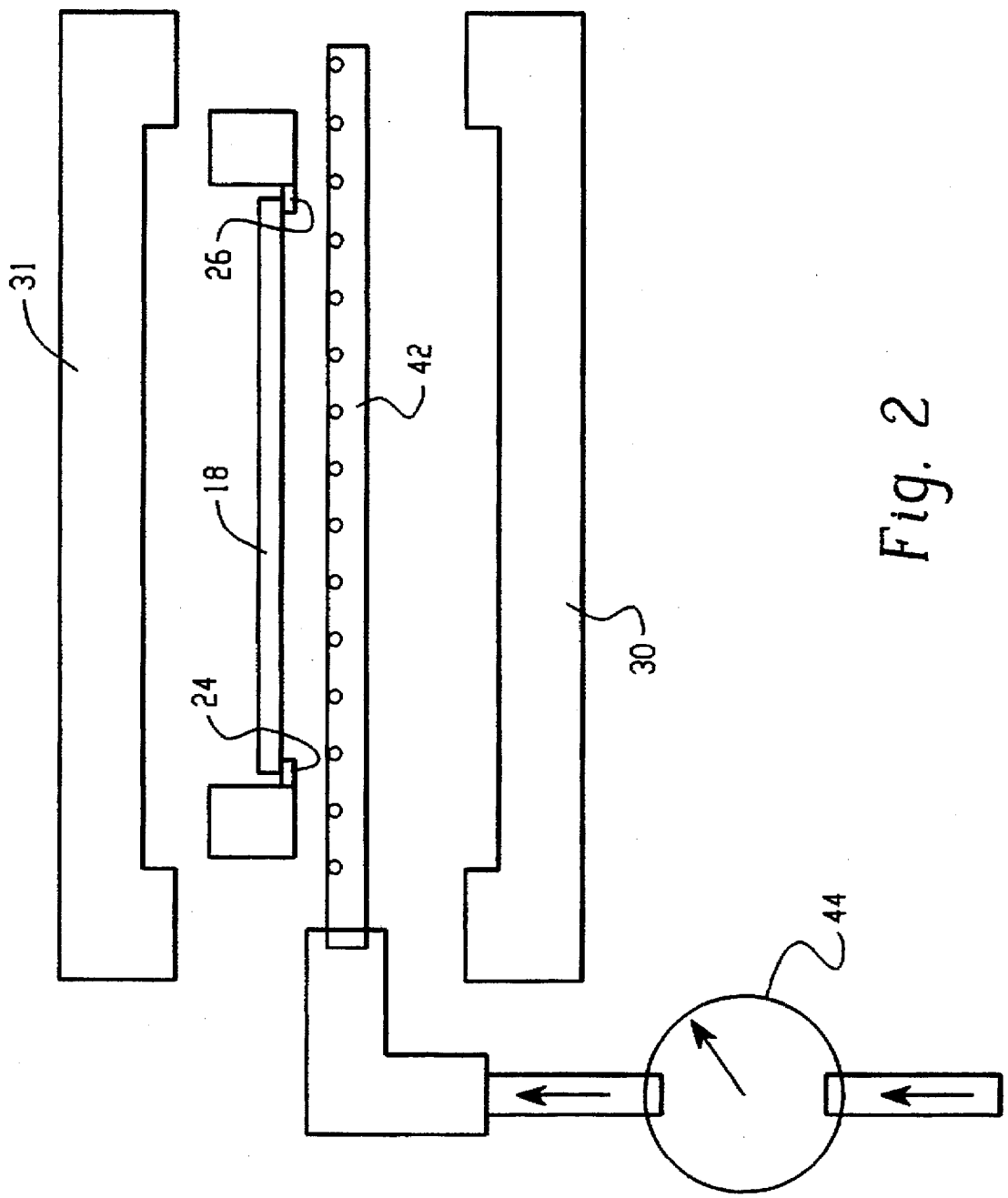
FIG. 2 is an end elevational view, also in schematic, taken on line 2—2 of FIG. 1.

Referring to FIGS. 1 and 2, the inventive wave soldering system includes a fluxing station generally indicated at 12, a preheating station generally indicated at 14, and a soldering station generally indicated at 16.

In fluxing station 12, a dielectric substrate 18, carried on a moveable conveyer system 20, is contacted with an aqueous-based no-clean flux by means of a flux applicator 22.

In the embodiment shown, dielectric substrate 18 is composed of a printed circuit board having two major surfaces, an upper surface and a lower surface, with a printed circuit design carried on its lower surface and defining a plurality of plated-through holes therein. A number of different electronic components (not shown) each having one or more pin-in-hole leads inserted in respective plated-through holes in the circuit board are carried on the upper surface of the dielectric substrate. Moveable conveyor system 20 supports dielectric substrate 18 on both lateral edges thereof (see conveyor supports 24 and 26 in FIG. 2) so that the underside of dielectric substrate 18 is open for receipt of flux and other materials. Conveyor system 20 is configured so that dielectric substrate 18, as well as the path of travel of dielectric substrate 18 through the system from fluxing station 12 through soldering station 16, is generally horizontal, although in the particular embodiment shown dielectric substrate 18 and its path of travel are inclined at a slight angle.

In fluxing station 12, the lower surface of dielectric substrate 18 is contacted with a no-clean aqueous based flux. A variety of different methods are well known for applying liquid fluxes to dielectric substrates in automatic wave soldering machines. Spraying and foaming are two of the most popular. In accordance with the present invention, any such method can be used. Of course, it is desirable that fluxing be accomplished in a manner which totally saturates the lower surface of the substrate. By "totally saturates" is meant that all areas of this lower surface not in contact with conveyor supports 24 and 26 (FIG. 4) are intimately and thoroughly contacted with the flux.

The chemical composition of the aqueous-based no-clean flux used in the present invention is not critical, and any liquid flux providing the desired fluxing properties as well as being free or at least substantially free of volatile organic compounds can be used for this purpose. A number of such compositions are already on the market and additional such compositions will no doubt become available in the near future.

After flux application in fluxing station 12, but before entering preheating station 14, dielectric substrate 18 is processed to remove excess flux therefrom. In the particular embodiment shown, this is accomplished by means of air knife 28. Air knife 28 directs a jet of gas at the lower surface of dielectric substrate 18 and thereby physically removes excess flux from the dielectric substrate. In other words, the excess flux is removed in significant part by the force of the moving air or other gas emanating from air jet 28 in addition to the effect caused by simple evaporation.

Although using an air jet (with air or other gas) is a typical and preferred way of accomplishing removal of excess flux from the dielectric substrate, other techniques can be employed in accordance with the present invention. For example, a mechanical implement such as a squeegee can be used to remove excess flux. Alternatively, the dielectric substrate can simply be allowed to sit for sufficient time before the next processing step so that excess flux will flow off the substrate under the influence of gravity. Use of an air knife, however, is preferred.

After excess flux is removed, dielectric substrate 18 passes into preheating station 14. In the embodiment shown in FIGS. 1 and 2, preheating station 14 includes first lower and upper radiant heaters 30 and 31 as well as second lower and upper radiant heaters 32 and 33. In conventional wave soldering processes, it is customary to heat the fluxed dielectric substrate to elevated temperatures, referred to hereinafter as "solder-receiving" temperatures. For example, in the above-mentioned Mehta, et al. patent, U.S. Pat. No. 5,297,724, the substrate is preheated to a solder-receiving temperature of about 200° C. before wave soldering. Preheating not only causes the liquid carrier of the flux to evaporate but also prevents excessive thermal shock to the substrate during the subsequent soldering slip. Preheating also reduces the heat load on the solder bath itself, since a significant amount of heat is added to the system via the dielectric substrate itself.

The precise solder-receiving temperature selected for a particular application of the invention process is not critical, and any conventional "solder-receiving" temperature can be used. Preferably, preheating will be done so that the substrate when preheating is finished will be at a solder-receiving temperature of at least about 100° C., preferably at least about 150° C., more preferably at least about 175° C.

After passing out of preheating station 14, dielectric substrate 18 passes into soldering station 16 where it is contacted with a wave of solder for forming the desired soldered joints. In the embodiments shown, soldering station 16 includes a solder pot 34 containing molten solder 36 and an impeller 38 which creates a wave of molten solder 40 for impinging on the lower surface of dielectric substrate 18 when positioned therein. Soldering station 16, as well as preheating station 14, for that matter, can be provided with the same or independent hoods or other containment devices (not shown) to prevent solder and noxious fumes from escaping and also to facilitate control of the atmosphere in the soldering station and preheating station respectively.

After solder joints are formed in solder station 16, moveable conveyor system 20 withdraws dielectric substrate 18 from contact with solder wave 40 to thereby produce the product soldered substrate. Since a no-clean flux is employed, a subsequent cleaning step such as by immersion or other technique is not required.

In accordance with the present invention, the no-clean flux used in the inventive process is free or substantially free of volatile organic compounds. Most typically, this no-clean flux will contain water as the liquid carrier of the flux. Because of the lower volatility of water as compared with volatile organic compounds, water will not totally evaporate from the dielectric substrate during the preheating operation, even when excess flux is removed from the dielectric substrate by air knife 28 or other similar device in a manner such as illustrated in FIG. 1. Furthermore, all of this water will not be eliminated even if the heat duty from radiant heaters 30, 31, 32 and 33 is increased to accommodate this difference in volatility. As a result, most automatic wave soldering machines in use today will not be capable of producing soldered dielectric product free of solder balls, solder bridges and solder webbing when using the new aqueous-based no-clean fluxes, even if the heat duty on the preheater elements is increased to a maximum level. Furthermore, adding additional heat through convection by flowing hot air or other gas along the surfaces of the dielectric substrate will also be largely ineffective. In accordance with the present invention, however, it has been found that essentially all of the residual water on the substrate can be evaporated and hence the production of solder balls, solder bridges and solder webbing eliminated, by directing a jet of gas at the dielectric surface by means of an air knife or other similar device.

This is illustrated in FIG. 1 which shows air knife 42 being arranged to direct a vigorous jet of gas directly at the lower surface of dielectric substrate 18 as it passes through preheating station 14. In the particular embodiment shown, air knife 28 is composed of a stainless steel tube 30 inches long and 0.25 inch in outside diameter and is equipped with 79 holes each hole measuring 0.030 inch in diameter and being spaced 0.375 inch apart, on centers. Moreover, each of these holes is arranged so as to direct a jet of gas in a direction normal to the lower surface of dielectric substrate 18. See FIG. 4.

As shown in FIG. 2, an air supply (not shown) is provided to supply air at elevated pressure to air knife 42, a valve 44 being provided so as to control the pressure and flow rate of the gas passing into air knife 42.

In the particular embodiment illustrated, air, regulated by valve 44 to a pressure of 20 psig, is supplied to air knife 42. At this pressure, the volume flow rate of air passing out of the individual holes in air knife 42 is approximately 0.5 Standard Cubic Feet per minute (SCFM). Also, air knife 42 in the embodiment shown is arranged 4.5 centimeters away from the lower surface of dielectric substrate 18, which results in the air passing out of air knife 14 striking dielectric substrate 18 with a force sufficient to remove substantially all water remaining in a substrate, including water that may be trapped between the surfaces of the plated through holes in the dielectric substrate and the pin-in-hole leads therein. As a result, there is substantially no formation of solder balls, solder bridges and solder webbing in the subsequent wave soldering step.

In carrying out the inventive process other operating conditions can also be employed. What is important is that the gas striking the dielectric substrate from air knife 42 blast substrate 42 with a vigorous jet of gas as opposed to simply flowing gas over the dielectric substrate surface. By a "vigorous" jet of gas is meant that the force created by the flow of gas is sufficient enough to physically deform a drop of flux carried on the substrate surface when observed by visual inspection. In general, this means that in the specific embodiment illustrated the flow rate of gas passing out of these jets is at least 0.4 SCFM, preferably 0.6 SCFM, while at the same time the air knife 42 is spaced no more than 6.5, preferably no more than 4.5 centimeters from the lower surface of the dielectric substrate. Where a different structure or arrangement of apparatus is employed for directing jets of gas at the dielectric substrate, the conditions of gas mass flow rate, gas pressure and the number, size and spacing of the holes creating the jets should be selected to generate jets of an equivalent force.

Also, although it is preferred that the individual holes in air knife 42 be arranged so that the gas jets emanating therefrom are arranged in a direction normal to the surface of the dielectric substrate impinged by the gas, arrangements which result in the jets impinging at the substrate surface at angles from >0 to 45° with respect to this normal are also possible. In any event, by employing jets of gas in the preheat section which vigorously impinge upon the dielectric substrate, it is possible to avoid the production of solder balls, solder bridges and solder webbing, even if an aqueous-based no-clean flux is used in the wave of soldering operation.

In accordance with another aspect of the present invention, it has also been found that the effect of reducing or eliminating the production of solder balls, solder bridges and solder webbing can be enhanced by controlling the temperatures of the different heating elements used in the preheating station. In most commercial wave soldering machines, multiple heating devices arranged in series along the path of travel are provided. For example, in the embodiment of the invention illustrated in FIGS. 1 and 2, dielectric substrate 18 first encounters lower and upper first radiant heaters 30 and 31, and then encounters second lower and upper radiant heaters 32 and 33. In conventional commercial processes, second radiant heaters 32 and 33 are operated at higher temperatures than are first radiant heaters 30 and 31. In the process illustrated in the above noted U.S. Pat. No. 5,297,724 to Mehta, et al., these heaters are operated at the same temperature. In accordance with the present invention, it has been found that elimination of solder balls, bridges and webbing can further be enhanced by operating the first heaters at a higher temperature than the second heaters. Preferably, these heaters are operated at a temperature difference of at least 50° C., although improved results have also been found when the difference in temperatures is as low as 20° C.

Figure 3:
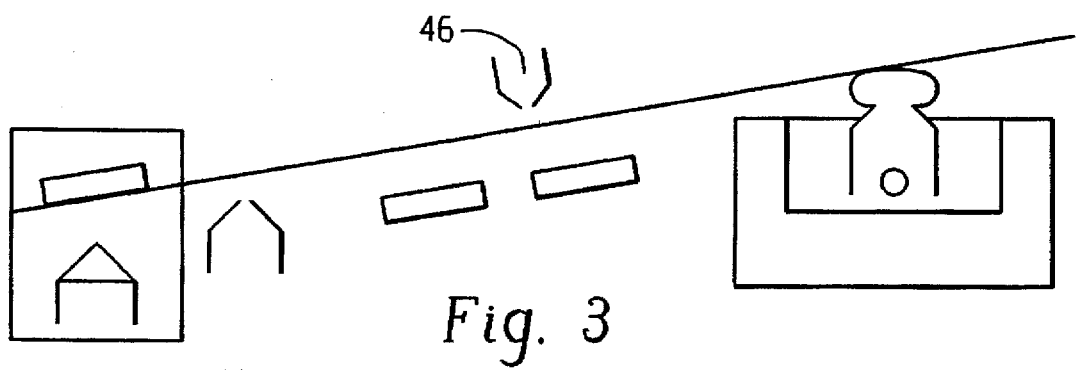
FIG. 3 is a schematic diagram similar to FIG. 1 illustrating a second embodiment of the present invention.
Figure 4:
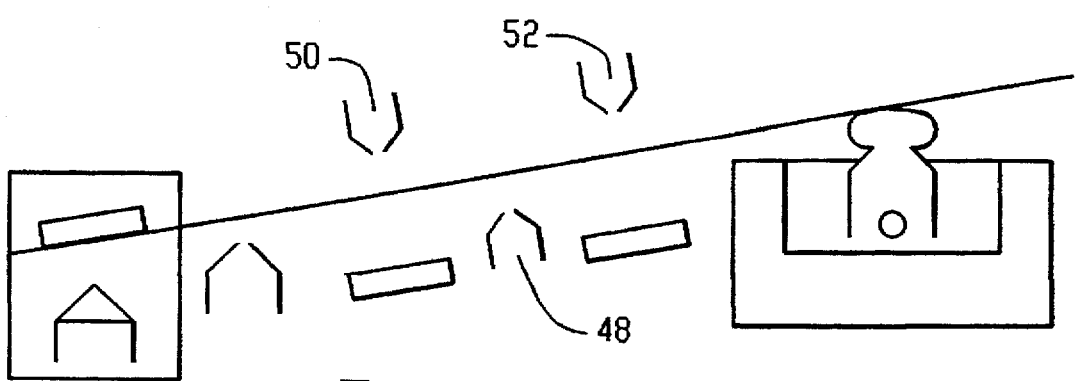
FIG. 4 is another schematic diagram similar to FIGS. 1 and 2 illustrating a third embodiment of the present invention.

Other embodiments of the invention are illustrated in FIGS. 3 and 4. In these embodiments, the arrangement of the fluxing station, preheating station and soldering station are essentially the same as that in FIG. 1. However, in the embodiment of FIG. 3, air knife 46 for eliminating solder balling, bridging and webbing is provided above dielectric substrate 18 rather than below. In the embodiment of FIG. 4, multiple air knives are provided, with at least one air knife being provided on each side of the dielectric substrates and in addition multiple air knives being provided on the upper side of dielectric substrates 18. These figures illustrate that the precise number, location and structure of the individual air knives can be varied as desired so as to design an optimal system for the particular operating environment involved.

Although only a few embodiments of the invention have been illustrated above, it should be appreciated that many modifications can be made without departing from the spirit and scope of the invention. All such modifications are intended to be included within scope of the present invention, which is to be limited only by the following claims:

We claim:

1. A method for preventing the formation of solder balls, solder bridges and solder webbing during a wave soldering process for forming solder joints on a dielectric substrate, said wave soldering process including the step of contacting said substrate with an aqueous no-clean flux substantially free of volatile organic compounds for improving the adhesion of solder to selected areas of said substrate, said process comprising directing a jet of gas at said substrate while said substrate is being preheated so that said substrate is substantially free of water from said aqueous flux when said substrate is contacted with a molten wave of solder, said jet of gas being vigorous enough to physically deform a drop of flux carried on substrate, whereby formation of solder balls, solder bridges and solder webbing is substantially prevented.

2. The method of claim 1, wherein said substrate is preheated by the application of radiant energy.

3. A wave soldering method for forming a soldered substrate, said method comprising
   (a) contacting a substrate having two major surfaces with a no-clean aqueous flux, said substrate comprising a planar dielectric sheet defining a plurality of plated-through-holes, said substrate carrying at least one electronic component having pin-hole leads in respective plated-through-holes in said substrate,
   (b) removing excess flux from said substrate, (c) preheating said substrate to a solder-receiving temperature, said substrate being moved along a path of travel during said preheating step, wherein said substrate is preheated by at least two preheaters arranged in series along said path, and wherein the temperature of the heat emitted by the first preheater encountered by said substrate along said path is higher than the temperature of the heat emitted by the second preheater along said paths.

(d) contacting said substrate with a wave of molten solder to form solder joints thereon, and (e) removing said substrate from said solder wave to form said soldered substrate, said process further comprising directing a vigorous jet of gas at said substrate during said preheating step so that formation of solder balls, solder bridges and solder webbing in step (d) is substantially prevented.

4. The method of claim 3, wherein said first and second preheaters are radiant preheaters.

5. A wave soldering method for forming a soldered substrate, said method comprising (a) contacting a substrate having two major surfaces with a no-clean aqueous flux, (b) removing excess flux from said substrate, (c) preheating said substrate to a solder-receiving temperature, said substrate moving along a path of travel during said preheating step, (d) contacting said substrate with a wave of molten solder to form solder joints thereon, and (e) removing said substrate from said solder wave to form said soldered substrate, wherein during said preheating step, said substrate is preheated by at least two preheaters arranged in series along said path, the temperature of the heat emitted by the first of said preheaters encountered by said substrate along said path being higher than the temperature of the heat emitted by the second of said preheaters.

6. The method of claim 5, further comprising directing a jet of gas at said substrate during said preheating step so that formation of solder balls, solder bridges and solder webs from residual water derived from said aqueous flux is substantially eliminated when said substrate is contacted with said solder wave.

7. A wave soldering apparatus for forming a soldered substrate, said apparatus comprising (a) a flux applicator for contacting a substrate having two major surfaces with a no-clean aqueous flux, said substrate comprising a planar dielectric sheet defining a plurality of plated-through-holes, said substrate carrying at least one electronic component having pin-in-hole leads in respective plated-through-holes in said substrate, (b) means for removing excess flux from said substrate, (c) means for preheating said substrate to a solder-receiving temperature, (d) a solder station for contacting said substrate with a wave of molten solder to form solder joints thereon, and (e) means for removing said substrate from said solder wave to form said soldered substrate, said apparatus further comprising means for directing a vigorous jet of gas at said substrate during said preheating step so that a drop of flux carried on said substrate is physically deformed by said jet, whereby formation of solder balls, solder bridges and solder webbing in said solder station is substantially prevented.

8. The apparatus of claim 7, wherein said apparatus further includes a conveyor system for moving said substrate along a path of travel, and wherein said means for preheating said substrate includes at least two preheaters arranged in series along said path.

9. The apparatus of claim 8, wherein said preheaters are radiant preheaters.

10. A wave soldering method for forming a soldered substrate, said method comprising (a) contacting a substrate having two major surfaces with a no-clean aqueous flux, said substrate comprising a planar dielectric sheet defining a plurality of plated-through-holes, said substrate carrying at least one electronic component having pin-in-hole leads in respective plated-through-holes in said substrate, (b) removing excess flux from said substrate, (c) preheating said substrate to a solder-receiving temperature, (d) contacting said substrate with a wave of molten solder to form solder joints thereon, and (e) removing said substrate from said solder wave to form said soldered substrate, said process further comprising directing a jet of gas at said substrate during said preheating step, said jet of gas being vigorous enough to physically deform a drop of flux carried on said substrate, whereby formation of solder balls, solder bridges and solder webbing in step (d) is substantially prevented.

11. The method of claim 10, wherein said flux is substantially free of volatile organic compounds.

12. The method of claim 11, wherein said soldered substrate is formed without subjecting the substrate upon removal from said solder wave to a cleaning step to remove flux and flux residues therefrom.

13. The method of claim 10, wherein said jet of gas impinges directly on a first major surface of said substrate.

14. The method of claim 13 wherein said jet of gas is directed at said substrate at an angle of 0 to 45 degrees with respect to a line normal to said first major surface.

15. The method of claim 14, wherein said jet of gas is directed at said substrate in a direction which is normal to said first major surface.

16. The method of claims 14, wherein said jet is located no more than 6.5 cm away from said first major surface.

17. The method of claim 16, wherein excess flux is removed from the surfaces of said substrate prior to said preheating step by directing a jet of gas at said substrate.

18. The method of claim 16, wherein said substrate is arranged in a generally horizontal position and further wherein said first major surface is the lower major surface of said substrate.

19. The method of claim 16, wherein said substrate is arranged in a generally horizontal position and further wherein said first major surface is the upper major surface of said substrate.

20. The method of claim 16, wherein a plurality of jets of gas are directed at said substrate during said preheating step.

21. The method of claim 20, wherein said substrate moves along a path of travel during said preheating step, and further wherein said plurality of jets of gas are located at different locations along said path of travel.

22. The method of claim 20, wherein at least one jet of gas is directed at each major surface of said substrate.

* * * * *